(12) United States Patent
Hau et al.

(10) Patent No.: US 6,353,360 B1
(45) Date of Patent: Mar. 5, 2002

(54) LINEARIZED POWER AMPLIFIER BASED ON ACTIVE FEEDFORWARD-TYPE PREDISTORTION

(75) Inventors: Gary Hau; Naotaka Iwata, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/778,765

(22) Filed: Feb. 8, 2001

(30) Foreign Application Priority Data

Feb. 8, 2000 (JP) ........................................ 2000-030527

(51) Int. Cl.[7] ................................................ H03F 1/26
(52) U.S. Cl. ........................................ 330/149; 330/151
(58) Field of Search ................................ 330/149, 151, 330/302

(56) References Cited

U.S. PATENT DOCUMENTS 4,122,399 A * 10/1978 Heiter et al. ................. 330/149
5,523,716 A * 6/1996 Grebliunas et al. .......... 330/149
5,966,049 A * 10/1999 Yuen et al. ................... 330/149
6,016,076 A * 1/2000 Arell ............................ 330/149

* cited by examiner

*Primary Examiner*—Robert Pascal
*Assistant Examiner*—Henry Choe
(74) *Attorney, Agent, or Firm*—Sughrue Mion, PLLC

(57) ABSTRACT

A linear power amplifier includes a driver stage, employing an active feedforward-type predistorter, connected in cascade with a final power stage. The active feedforward-type predistorter has an amplifier with a predistorter connecting between its input and output. This driver stage has opposite gain and phase characteristics to that of the final power stage and is used to predistort an input signal. When combined with the final power stage, the nonlinear gain and phase of the power stage are compensated and linearized by the driver stage, resulting in a linear power amplifier with low distortion amplification and high efficiency operation.

22 Claims, 16 Drawing Sheets

LINEARIZED POWER AMPLIFIER BASED ON ACTIVE FEEDFORWARD-TYPE PREDISTORTION

BACKGROUND OF THE INVENTION

The present invention relates to a linearized power amplifier based on active feedforward-type predistortion, and more particularly to linear power amplifiers for low distortion amplification of digitally modulated signals in cellular and satellite communication systems. More particularly, the invention relates to such a power amplifier for monolithic microwave integrated circuit (JAMIC) realization which includes an active feedforward-type predistorter and an output power amplifier and in which the predistorter amplifies and distorts the incoming signals for compensating the amplitude and phase nonlinearities of the output power amplifier and enhancing the PAE (power added efficiency) for linear amplification of incoming signals.

Digital modulation schemes are widely employed in various multi-carrier communication systems, such as wireless and satellite, for capacity improvement, better transmitted quality and high data rate transmission. In non-constant envelope digital modulation schemes, information is contained in both amplitude and phase of the modulated signals. To amplify such signals, linear amplifiers are required to prevent distorting the amplitude and phase characteristics which would degrade signal quality. In addition, linear amplifiers are also beneficial in amplifying multi-carrier signals simultaneously, in applications such as cellular basestations, without creating significant distortion. The advantage of employing linear amplifiers is that it reduces the number of amplifiers used as well as eliminates high power combiner chains, which is the conventional configuration for combining output power from several less linear amplifiers to limit distortion. This directly results in reducing size, complexity and cost of the overall amplification systems which is critical in applications such as satellite systems and cellular base stations. In addition to its low distortion characteristics, linear amplifiers should also attain high efficiency such that their DC power consumption can be minimized, resulting in higher performance, reliability and reduction of operating costs. Such features of linear amplifiers are highly desirable in all communication systems, and, in particular, cellular handsets in wireless systems wherein the overall size can be miniaturized and battery life, therefore the standby and talk time, can be significantly improved as a direct consequence of improved amplifier efficiency which is a primary concern in handset design.

To achieve linear amplification of non-constant envelope modulated signals in wireless communication systems, for instance, conventional amplifiers usually operate at certain output power backoff from saturated power in order to meet the linearity requirement. The tradeoff of this is a low PAE on the amplifiers since peak PAE is usually achieved near saturated output power level. By backing off from that operation, amplifiers could suffer as much as 30% to 40% reduction in PAE which has an adverse effect on DC power consumption, and, in particular, the battery life in cellular handsets.

The drawback of low efficiency on conventional linear amplifiers can be overcome by employing amplifier linearization techniques. Amplifier linearization techniques require the use of external circuitry to reduce distortion level at the output of amplifiers, thus allowing the amplifiers to operate into more efficient but nonlinear region, achieving high efficiency and good linearity simultaneously.

Common linearization techniques such as feedforward, predistortion, and feedback techniques have been disclosed in "Feedfoward—An alternative approach to amplifier linearization," by T. J. Bennett et al., The Radio and Electronic Engineer, vol. 44, no. 5, pp. 257–262, May 1974; "Feedforward linearization of 950 MHz amplifiers," by R. D. Stewart et al., IEEE Proceedings-H, vol. 135, no. 5, pp. 347–350, October 1988; U.S. Pat. No. 5,850,162 by Danielsons; "An automatically controlled predistorter for multi-level quadrature amplitude modulation,' by J. Namiki, IEEE Trans. Commun., vol. COM-31, no. 5, pp. 707–712, May 1983; U.S. Pat. No. 4,465,980 by Huang et al.; U.S. Pat. No. 5,523,716 by Grebliunas et al.; "An MMAC C-Band FET feedback power amplifier," by A. K. Ezzeddine et al., IEEE Trans. Microwave Theory Tech., vol. MTT-38, no. 4, pp. 350–357, April 1990; "Linearisation of microwave power amplifiers using active feedback networks," by F. Perez et al., Electron Lett., vol. 21, no. 1, pp. 9–10, January 1985; "An MMIC linearized amplifier using active feedback," by J. C. Pedro et al., 1993 IEEE MTT-S Dig., pp. 95–98; U.S. Pat. No. 5,886,572 by Myers et al.; U.S. Pat. No. 5,821,814 by Katayama et al. These techniques, however, usually involve either complex circuit configurations or experience possible stability problem which limit their practical applications in miniaturized cellular handsets.

Recently, predistorters with simpler configuration have been disclosed in "A normal amplitude and phase linearizing technique for microwave power amplifiers," M. Nakayama et al., 1995 IEER MTT-S Dig., pp. 1451–1454; "A novel series diode linearizer for mobile radio power amplifiers," by K. Yamauchi et al., 1996 IEEE MTT-S Dig., pp. 831–834; "Passive FETMMIC linearizers for C, X and Ku-band satellite applications," A. Katz et al., 1993 IEEE MTT-S Dig., pp. 353–356; U.S. Pat. No. 5,191,338 by Katz et al. Although these predistortions achieve size reduction over conventional designs, they still require extra matching circuits, experience high loss and poor isolation which increase the difficulty in practical use. These are best illustrated by reference to the conventional miniaturized predistorter design shown in FIG. 1.

FIG. 1 shows a typical small-size passive type predistorter 104, including a nonlinearity generator 102, input matching circuit 101 and output matching circuit 103. The matching circuits usually include inductors which would take up significant area in an MMIC and increase the cost of the overall design. FIG. 2 shows a conventional configuration of a linearized power amplifier 206. The passive type predistorter 104, as illustrated in FIG. 1, is employed to compensate the nonlinear characteristics of a power amplifier 205. An isolator 201 and buffer amplifier 203 are required to compensate the poor reverse isolation and insertion loss of the predistorter 104, respectively. Matching circuits 202 and 204 are employed to match the input and output of the buffer amplifier 204 to the isolator 201 and the power amplifier 205, respectively. The disadvantages of this configuration include the requirement of extra matching circuits 202 and 204, buffer amplifier 203 and isolator 201, which increases the overall size of the linearized amplifier 206, and extra DC power consumption required by the buffer amplifier 203. The linearized amplifier 206 is, therefore, not practical for cellular handset applications which demands small size and low overall power consumption.

While prior art of low complexity passive type predistorter eliminates the use of bulky element. Such as power combiners, variable attenuators and phase shifters usually employed in conventional design, it includes nonlinearity generator with input and output matching. circuits. When cascaded with a power amplifier, the output matching of the predistorter duplicates the function of the input matching circuit of the amplifier. Since matching circuits usually include inductors which require large area to realize on MMICs, this increases the size of the chip and the colt of the overall design which are a critical concern for handset power amplifiers, and might not be feasible for volume production. In addition, conventional predistorters usually experience poor reverse isolation. Power amplifiers incorporating the predistorters require additional isolators to improve circuit isolation to avoid interaction between the predistorters and amplifier stages which would degrade overall circuit performance. Isolators usually comes in the form of individual module and would be unsuitable to add on a small circuit area that is available in cellular handsets. Predistorters shown in prior art are all passive in nature with insertion loss level ranges from 4 dB to 20 dB depending on the design. Extra buffer amplifiers are usually added to compensate the high insertion loss. The use of buffer amplifiers is of particular concern as that would increase overall DC power consumption. Even though the overall efficiency of the linearized amplifier is improved, the extra DC power requirement places extra strain on the battery life in handsets and such amplifier configuration is considered unsuitable for handset application. Furthermore, these known predistorters usually requires accurate tuning in order to obtain the expected efficiency improvement and therefore might not be practical in terms of mass production and ease to use.

In the above circumstances, it had been required to develop a novel linearized power amplifier free from the above problem.

SUMMARY OF THE INVENTION

Accordingly, it is an object of the present invention to provide a novel linearized power amplifier free from the above problems.

It is a further object of the present invention to provide a novel linearized power amplifier which offers linear power amplification with high efficiency and which are improved in size and DC power consumption.

The present invention provides a linear power amplifier consists of a driver stage, employing an active feedforward-type predistorter, connected in cascade with a final power stage. The active feedforward-type predistorter consists of an amplifier with a predistorter connecting between its input and output. This driver stage has opposite gain and phase characteristics to that of the final power stage and is used to predistort an input signal. When combined with the final power stage, the nonlinear gain and phase of the power stage are compensated and linearized by the driver stage, resulting in a linear power amplifier with low distortion amplification and high efficiency operation.

According to another aspect of the present invention, a tunable biasing circuit allows tuning on the active feedforward-type predistorter using an external DC voltage. By tuning the characteristics of the active feedforward-type predistorter, the predistorter can be employed to compensate various degree of nonlinearities of any power stage.

These and other aspects of the present invention as disclosed herein will become apparent to those skilled in the art after a reading of the following description of the preferred embodiment when considered with the drawings.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DISCLOSURE OF THE INVENTION

Figure 1:
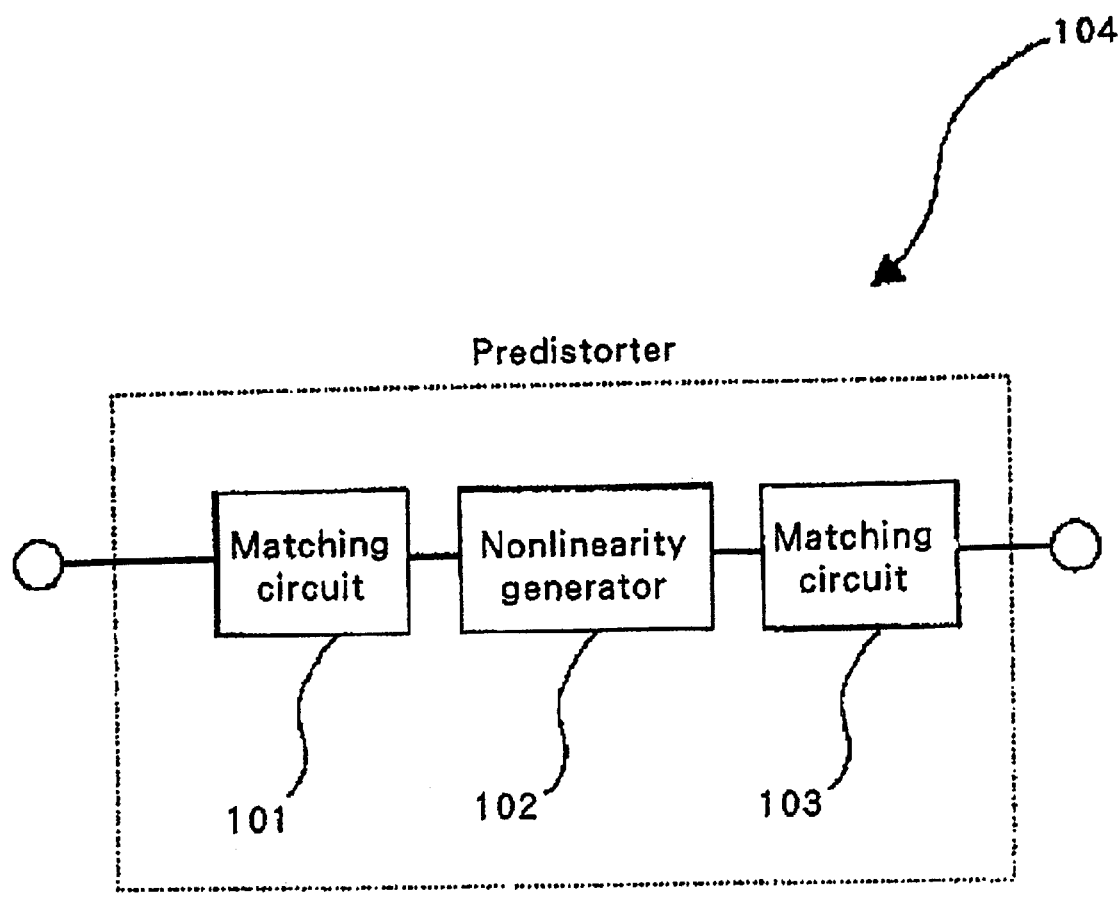
FIG. 1 is a simplified block diagram of a conventional miniaturized predistorter including input and output matching circuits, and a nonlinear generator for predistorting incoming signals.
Figure 2:
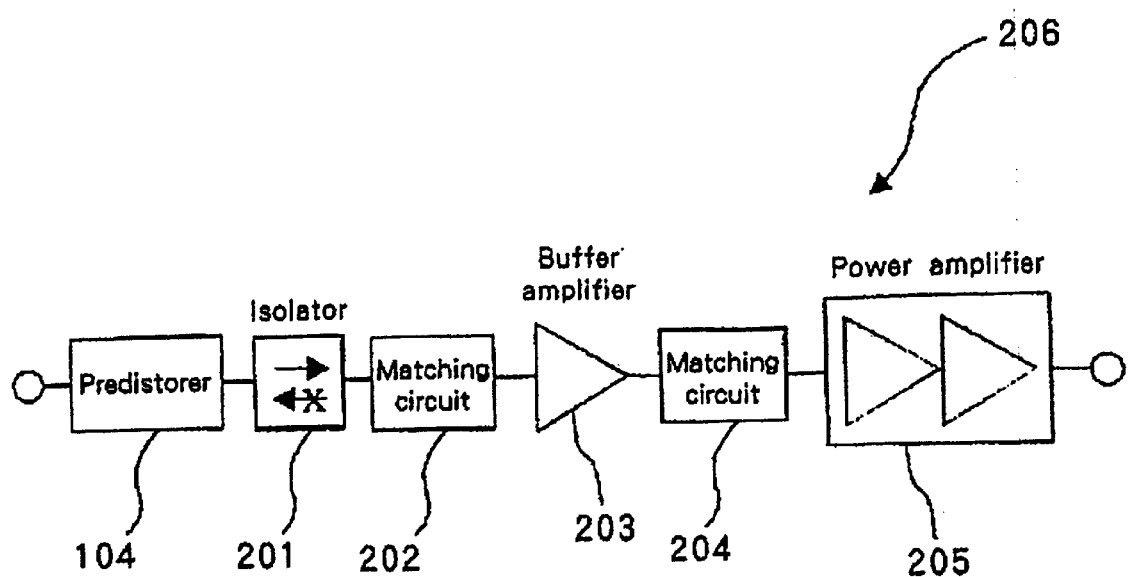
FIG. 2 is a simplified block diagram of a conventional linearized amplifier based on predistortion linearization.

The first present invention provides a linearized amplifier comprising: an RF input node; an RF output node; a power amplifier having an input and an output, and having a gain characteristic which decreases with the increase in input power applied to said input of said power amplifier, and having a phase characteristic which increases with input power applied to said input of said power amplifier; and an active feedforward-type predistorter having an input and an output, acting as a driver amplifier which amplifies signal applied to said RF input node, having a gain characteristic which increases with input power applied to said input of said active feedforward-type predistorter for compensating the decrease in gain of said power amplifier, and having a phase characteristic which decreases with the increase in input power applied to said input of said active feedforward-type predistorter for compensating the increase in phase of said power amplifier, wherein said output of said power amplifier is coupled to said RF output node, said input of said active feedforward-type predistorter is coupled to said RF input node, and said output of said active feedforward-type predistorter is coupled to said input of said power amplifier.

It is preferable that the active feedforward-type predistorter comprises: an RF input node; an RF output node; a ground node; a first and second DC power supply node; a bipolar transistor having a collector, a base and an emitter; a first matching circuit having an input coupled to said RF input node awl an output coupled to said bipolar transistor base for matching said bipolar transistor base to a first predetermined impedance; a second matching circuit having an input coupled to said bipolar transistor collector and an output coupled to said RF output node for matching said bipolar transistor collector to a second predetermined impedance; a feedforward-type predistorting circuit having an input coupled to said bipolar transistor base and an output coupled to said bipolar transistor collector; a first biasing circuit having an input coupled to said first DC power supply node and an output coupled to said bipolar transistor base; and a second biasing circuit having an input coupled to said second DC power supply node and an output coupled to said bipolar transistor collector, wherein said bipolar transistor emitter is coupled to said ground node.

It is further preferable that the bipolar transistor in the active feedforward-type predistorter is biased in active mode for amplification purpose through the first and second DC power supply nodes in said active feedforward-type predistorter.

It is further preferable that the active feedforward-type predistorter has an insertion gain characteristic which increases with input power.

It is further preferable that the active feedforward-type predistorter has an insertion phase characteristic which decreases with the increase in input power.

It is further preferable that said feedforward-type predistorting circuit comprises: an RF input node; an RF output node; a ground node; a DC power supply node; a bipolar transistor having a collector, a base and an emitter; a first capacitor having an input coupled to said RF input node and an output coupled to said base of said bipolar transistor; a second capacitor having an input coupled to said bipolar transistor collector and an output coupled to said ground node; a third capacitor having an input and an output; a LC-network having an input coupled to said bipolar transistor emitter and an output coupled to said ground node; a resistor having an input coupled to said bipolar transistor emitter and an output coupled to said third capacitor input; and a biasing circuit having an input coupled to said DC power supply node and an output coupled to said bipolar transistor base, wherein said third capacitor output is coupled to said RF output node.

It is further preferable that the LC-network in the feedforward-type predistorting circuit comprises an inductor and a capacitor connected in parallel.

It is further preferable that said bipolar transistor in the feedforward-type predistorting circuit is slightly forward biased for non-linearities generation through the DC power supply node of the feedforward-type predistorting circuit.

It is further preferable that said feedforward-type predistorting circuit has an insertion loss characteristic which decreases with the increase in input power.

It is further preferable that said feedforward-type predistorting circuit has an insertion phase characteristic which decreases with the increase in input power.

It is further preferable that the biasing circuit in the feedforward-type predistorting circuit is a tunable biasing circuit for adjusting the characteristics of the active feedforward-type predistorter electronically.

It is further preferable that said tunable biasing circuit comprises: an input node; an output node; a ground node; a bipolar transistor having a collector, a base and an emitter; an inductor having an input and an output; a first resistor having an input coupled to said input node and an output coupled to said base of said bipolar transistor; a second resistor having an input coupled to said bipolar transistor emitter and an output coupled to said inductor input; and a capacitor having an input coupled to said second resistor output and an output coupled to said ground node, wherein said bipolar transistor collector is coupled to said second DC power supply node in the active feedforward-type predistorter, and said inductor output is coupled to said output node.

It is further preferable that the DC power supply node in the feedforward-type predistorting circuit can be adjusted externally which changes the biasing voltage applied to the bipolar transistor base in the feedforward-type predistorting circuit to change the gain and phase characteristics of the active feedforward-type predistorter.

It is further preferable that the feedforward-type predistorting circuit comprises: an RF input node; an RF output node; a ground node; a DC power supply node; a diode having an input and an output; a first capacitor having an input coupled to said RF input node and an output coupled to said diode input; a second capacitor having an input and an output; an LC-network having an input coupled to said diode output and an output coupled to said ground node; a resistor having an input coupled to said diode output and an output coupled to said second capacitor input; and a biasing circuit having an input coupled to said DC power supply node and an output coupled to said diode input, wherein said second capacitor output is coupled to said RF output node.

It is further preferable that the LC-network in the feedforward-type predistorting circuit comprises an inductor and a capacitor connected in parallel.

It is further preferable that the diode in the feedforward-type predistorting circuit is slightly forward biased for non-linearities generation through the DC power supply node of the feedforward-type predistorting circuit.

It is further preferable that the feedforward-type predistorting circuit has an insertion gain characteristic which decreases with the increase in input power.

It is further preferable that the feedforward-type predistorting circuit has an insertion phase characteristic which decreases with the increase in input power.

It is further preferable that the biasing circuit in the feedforward-type predistorting circuit is a tunable biasing circuit for adjusting the characteristics of the active feedforward-type predistorter electronically.

It is further preferable that the tunable biasing circuit comprises: an input node; an output node; a ground node; a bipolar transistor having a collector, a base and an emitter;

an inductor having an input and an output; a first resistor having an input coupled to said input node and an output coupled to said bipolar transistor base; a second resistor having an input coupled to said bipolar transistor emitter and an output coupled to said inductor input; and a capacitor having an input coupled to said second resistor output and an output coupled to said ground node, wherein said bipolar transistor collector is coupled to the second DC power supply node in the active feedforward-type predistorter, and said inductor output is coupled to said output node.

It is further preferable that the DC power supply node in the feedforward-type predistorting circuit can be adjusted externally which changes the biasing voltage applied to the diode input in said feedforward-type predistorting circuit to change the gain and phase characteristics of the active feedforward-type predistorting.

PREFERRED EMBODIMENT

Figure 3:
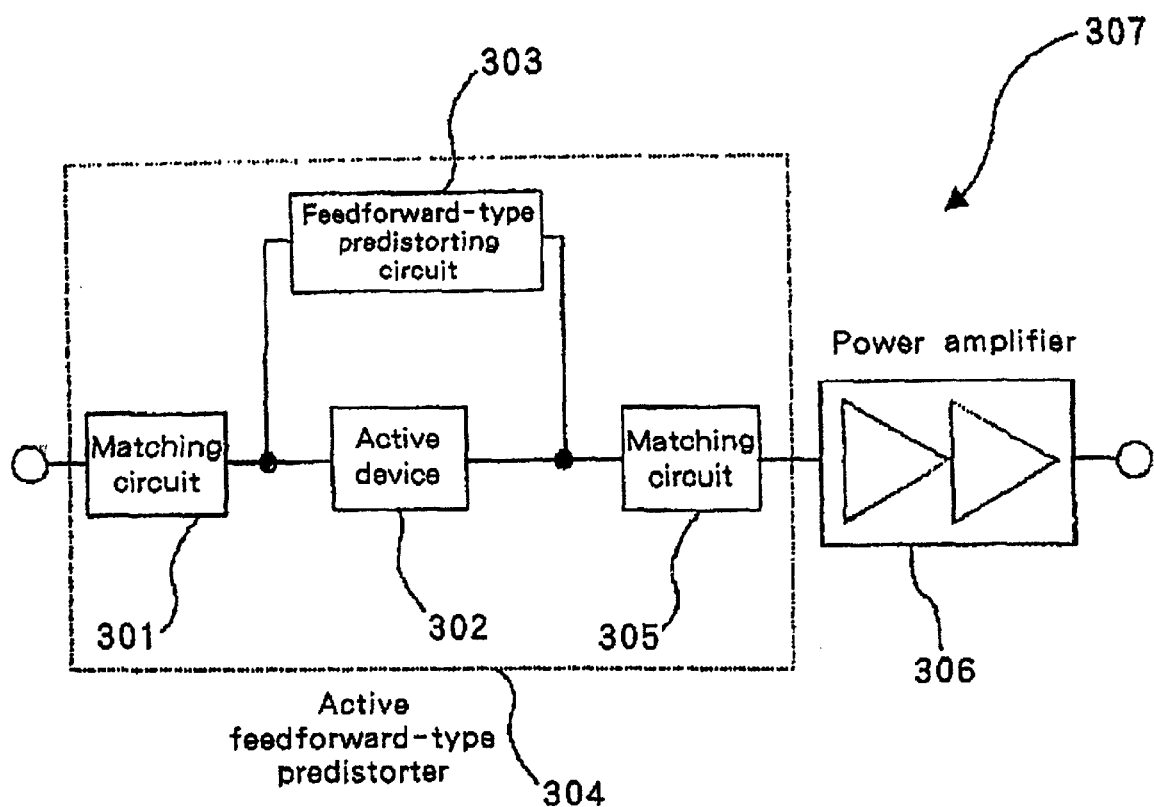
FIG. 3 is a block diagram of a linearized power amplifier employing an active feedforward-type predistorter according to an embodiment of the present invention.

A first embodiment according to the present invention will be described in detail with reference to the drawings. Referring to FIG. 3, there is shown a simplified block diagram of a linearized amplifier 307 according to an embodiment of the present invention. The linearized amplifier 307 includes an active feedforward-type predistorter 304 connected in cascade with a final stage power amplifier 306. The active feedforward-type predistorter 304 consists of an input matching circuit 301, an active device 302, a feedforward-type predistorting circuit 303 connected between the input and output terminals of the active device 302, and an inter-stage matching circuit 305. The input matching circuit 301 matches the input of the active device 302 to a 50 ohm system whereas the matching circuit 305 is an inter stage matching which matches the output of the active device 302 to the input of the power amplifier 306. The matching circuits are within the ordinary skill in the art. The active device 302, which can be a bipolar transistor or field effect transistor, is for the purpose of signal amplification. Therefore, the active feedforward-type predistorter 302 is active in nature, meaning that it provides insertion gain to the input signal, rather than insertion loss as in the conventional passive type predistorters. The final stage power amplifier 306 consists of either single or multiple power amplifiers depending on the output power requirement for different applications. The linearized amplifier 307 achieves higher linearity as well as efficiency over conventional design and the basic principle of its operation is described as follows. The active feedforward-type predistorter 304 is designed to have opposite gain and phase responses to that of the final stage power amplifier 306, which varies with input power level. The active feedforward-type predistorter 304 thus modifies and predistorts the amplitude and phase characteristics of the input signal according to the power level and also amplifies the input signal, thus acting au driver amplifier before the power amplifier stage 306, rather than linearly amplifies the signal au in the conventional design. The dual function offered by the active feedforward-type predistorter 304 allow to reduce the component counts over the conventional passive type predistorter configuration. The amplified and predistorted signal is then fed to the input of the final stage amplifier 306, which has an opposite gain and phase characteristics to that of the active feedforward-type predistorter 304 as a function of input power level. When the two are combined together to become the linearized amplifier 307, the non-linearities of the final stage power? amplifier 306 is compensated by the active feedforward-type predistorter 304, and thus more linear gain and phase responses at the output of the linearized amplifiers 307 are obtained. Therefore, & highly linear amplification of signal is achieved and allows the final stage power amplifier 306 to operate at higher efficiency region. For instance, final stage power amplifier 306 commonly experiences gain compression and phase expansion with the increase in input power level. The active feedforward-type predistorter 304 should then be arranged to have opposite responses, i.e. gain expansion and phase compression with the increase in input power level, and connected in cascade with the final power amplifier stage 306 to become the linearized amplifier 307 for high linearity and efficiency operation.

The linearized amplifier 307 can be realized either in the form of a hybrid circuit, a monolithic microwave integrated circuit (NMIC) or a combination of both. However, since a circuit according to the present embodiment has a compact configuration, it could be more desirable to implement au an MMIC such that it can be easily fabricated in small size at low cost, and is expected to be used in handset power amplifier application. In the following discussion, the realization of the linearized amplifier 307 will be illustrated as a two-stage power amplifier design, with output power level suitable for handset application in a mobile communication system and can be operated at low voltage supply level, i.e. in the range of 3 V to 6 V which is the common DC voltage available from portable battery.

Figure 4:
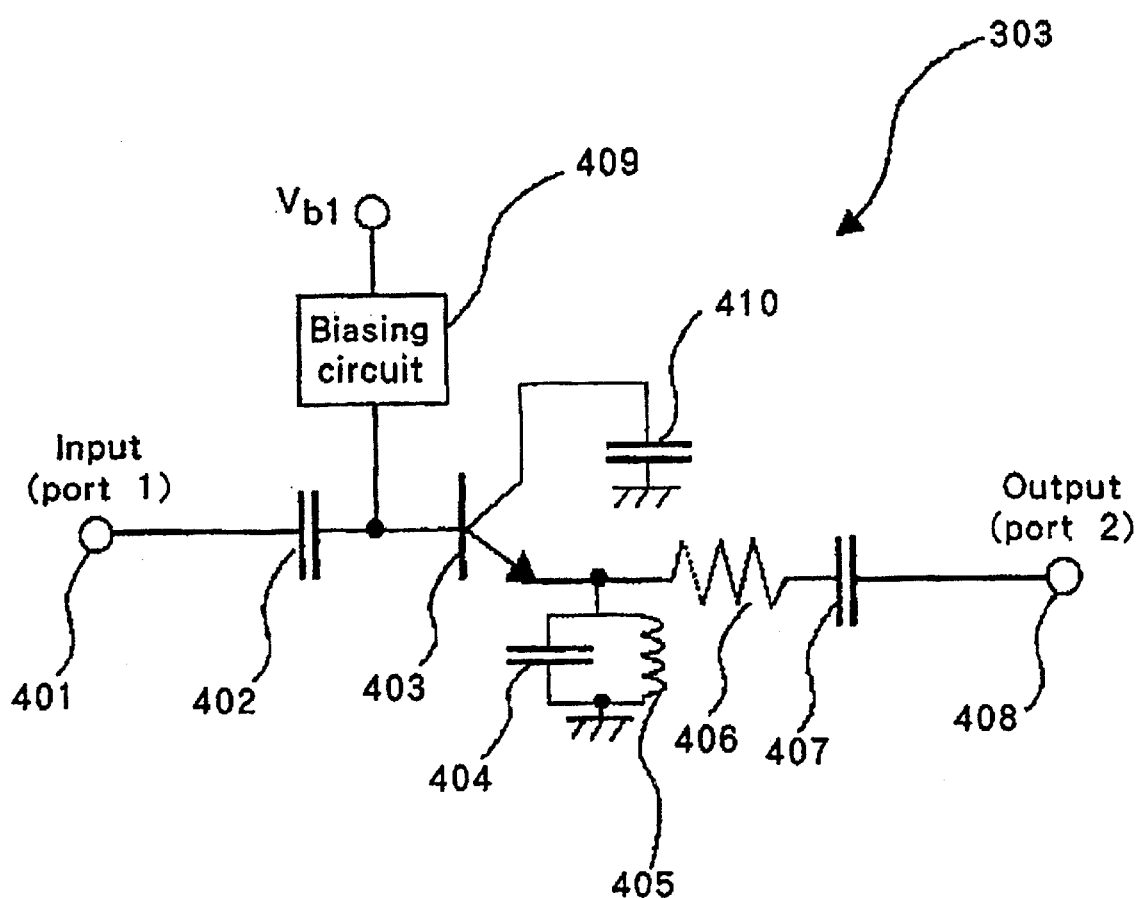
FIG. 4 is a schematic circuit diagram of a feedforward-type predistorting circuit used in the linearized power amplifier shown in FIG. 3.

FIG. 4 shows a schematic diagram of a feedforward-type predistorting circuit 303 according to the present embodiment. The feedforward-type predistorting circuit 303 includes a bipolar transistor 403. A DC blocking capacitor 402 connects the input (port 1) 401 to the base of the bipolar transistor 403. A capacitor 410 connects the collector of the bipolar transistor 403 to ground. A parallel LC-network, including an inductor 405 and a capacitor 404, connects the emitter of the bipolar transistor 403 to ground. Serially connected resistor 406 and DC blocking capacitor 407 couples the emitter of the bipolar transistor 403 to the output (port 2) 408.

A biasing circuit 409 connects the base of the bipolar transistor 403 to a DC biasing voltage Vb1. The biasing circuit 409 allows the DC biasing voltage Vb1 to be applied to the base of the bipolar transistor 403 whilst blocking input signal from the input 401 from reaching the DC power supply Vb1, thus providing isolation between the DC biasing voltage Vb1 and the input signal applied to the input. 401. The design of the biasing circuit 409 is within the ordinary skill in the art.

To achieve the characteristic and operate as a predistorter, the bipolar transistor 403 is slightly forward biased such that it operates in the nonlinear region. The degree of non-linearity depends on the DC biasing voltage V61. The resistor 406 controls the degree of signal to be feedforwarded from the input 40 to the output 408. The inductor 405 provides a DC path to ground whilst the capacitor 404 reduces the forward insertion loss of the feedforward-type predistorting circuit 303. The characteristics of the feedforward-type predistorting circuit 303 depends on the DC biasing voltage Vb1, the capacitors 402, 404, 407, 410 and the resistor 406. The values of these elements are chosen for optimum characteristics.

Figure 5A:
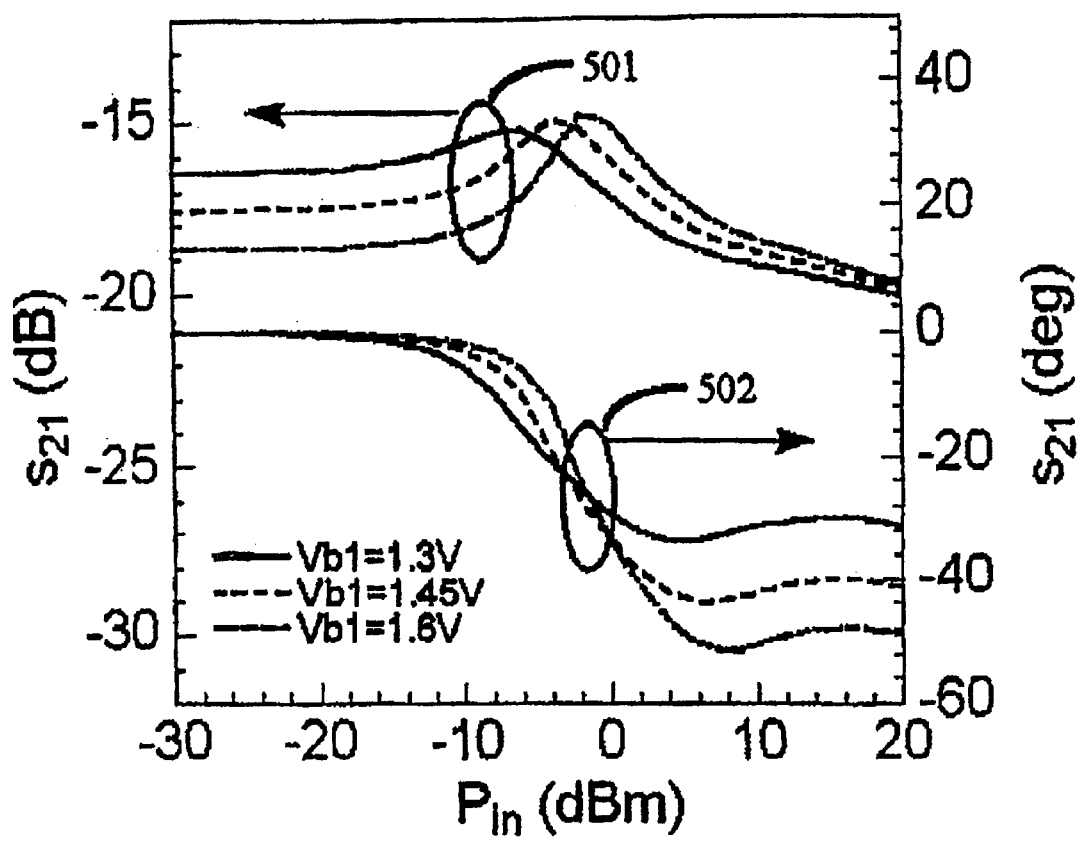
FIG. 5A is a graph showing the forward transmission characteristics of the feedforward-type predistorting circuit shown in FIG. 4 as a function of input power Pin and control voltage Vb1.

FIG. 5A shows the forward gain transmission characteristics and the forward phase transmission characteristics of the feedforward-type predistorting circuit 303 shown in FIG. 4 am a function of input power Pin and DC biasing voltage Vb1. The family of curve 501 shows the forward gain transmission characteristic, S21 (dB), and the family of curve 502 shows the forward phase transmission characteristic, S21 (deg). Referring to curves 501, the gain of the feedforward-type predistorting circuit 303 increases and expands to a peak level before reducing with the increase in input power level. The level of such gain expansion is a function of DC biasing voltage Vb1, therefore DC biasing voltage Vb1 can be used to adjust to characteristics of the feedforward-type predistorting circuit 303. Referring to curves 502, the phase decreases as the input power increases with the degree being a function of DC biasing voltage Vb1.

Figure 5B:
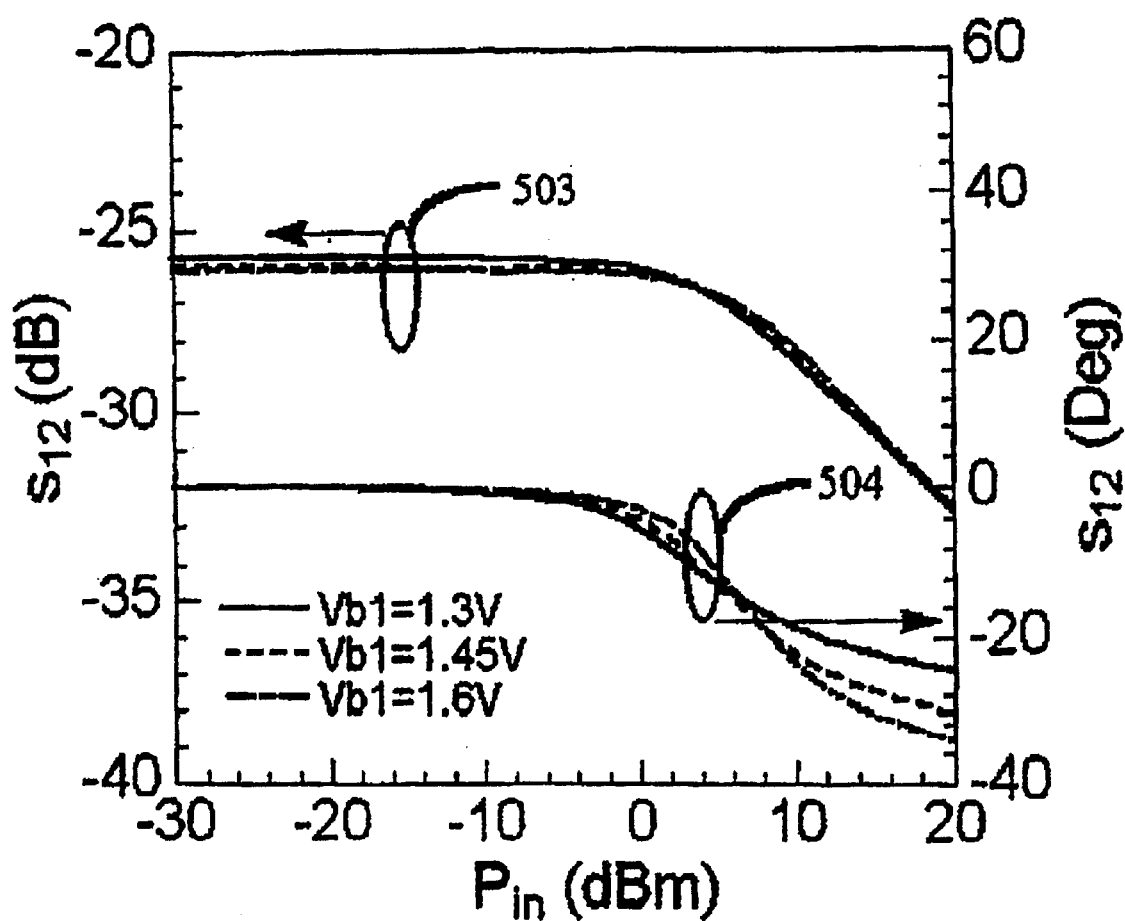
FIG. 5B is a graph showing the reverse transmission characteristics of the feedforward-type predistorting circuit shown in FIG. 4 as a function of input power Pin and control voltage Vb1.

FIG. 5B shows the reverse gain transmission characteristics and the reverse phase transmission characteristics of the feedforward-type predistorting circuit 303 shown in FIG. 4 as a function of input power Pin and DC biasing voltage Vb1. The family of curve 503 shows the reverse gain transmission characteristic, S12 (dB), and the family of curve 504 shows the reverse. phase transmission characteristic, S12 (deg). Referring to curves 503, the reverse gain of the feedforward-type predistorting circuit 303 is significantly lower than the forward gain 501. This shows the feedforward-type predistorting circuit 303 has a good isolation level and can minimize the level of signal being fed back from the output 409 to the input 401 of the feedforward-type predistorting circuit 303, providing excellent stability for operation. The reverse gain does not vary significantly with the DC biasing voltage Vb1, achieving good isolation for various value of DC biasing voltage Vb1 Referring to curves 504, the phase decreases as the input power increases but the degree does not vary significantly with DC biasing voltage Vb1.

Figure 6:
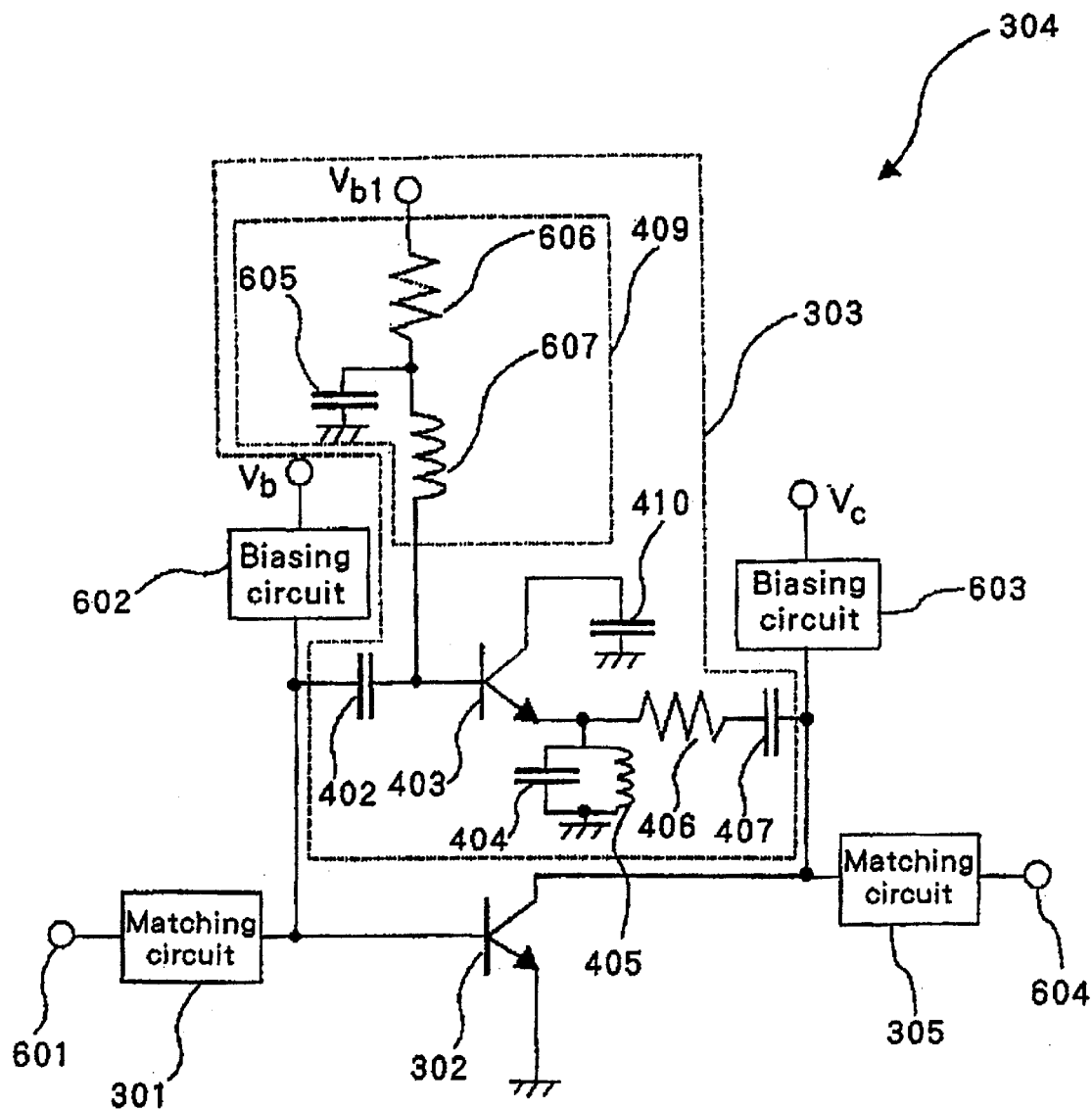
FIG. 6 is a schematic circuit diagram of an active feedforward-type predistorter used in the linearized power amplifier shown in FIG. 3.

FIG. 6 shows a schematic diagram of an active feedforward-type predistorter 304 according to the present embodiment. The active feedforward-type predistorter 304 includes a bipolar transistor 302 with input and output matching circuits 301 and 305 for input and output impedance matching to a 50 ohm system and the input of the following stage power amplifier 306, respectively. Each matching circuit may include a circuit of one or any number of lumped or distributed elements, providing any one or all of inductance, capacitance, and resistance, and the elements may be arranged in circuit of any complexity, au may be required by the application. The matching circuit is within the ordinary skill in the art. The biasing circuits 602 and 603 connect the base and collector, of the bipolar transistor 302 to the DC power supplies Vb and Vc, respectively. The design of the biasing circuits 602 and 603 is within the ordinary skill in the art. The DC biasing voltages Vc and Vb are set such that the bipolar transistor 302 is biased in active mode to operate as an amplifier.

The active feedforward-type predistorter 304 is formed by connecting the feedforward-type predistorting circuit 303 between the base and collector of the bipolar transistor 302. Apart from the biasing circuit 409, the feedforward-type predistorting circuit 303 is basically .similar to the one presented in FIG. 4. Therefore, like elements are referred to like reference numerals, and the detailed functions of like elements and the operating principle of the feedforward-type predistorting circuit 303 are not repeated except for the function of the biasing circuit 409.

The biasing circuit 409 in the feedforward-type predistorting circuit 303 includes an RF choke 607, which blocks the RF signal, connecting the base of the bipolar transistor 403 to a DC power supply Vb1 via a bias resistor 606, which sets the biasing current flowing into the base of the bipolar transistor 403. A bypass capacitor 605 connects the RF choke 607 to ground which removes high frequency noise.

The active feedforward-type predistorter 304 integrates an amplifier circuit, based on the bipolar transistor 302, together with the feedforward-type predistorting circuit 303. This configuration eliminates the need of extra matching circuits required for the feedforward-type predistorting circuit 303, thus reducing the overall circuit size and complexity, making it suitable for miniaturized realization. The degree. of predistortion of an input signal is controlled by the feedforward-type. predistorting circuit 303. Since the bipolar transistor 302 operates as an amplifier, the active feedforward-type predistorter 304 is able to achieve insertion gain .instead of insertion loss shown in prior art. The active feedforward-type predistorter 304 therefore does not degrade the overall gain when combined with other amplifier stages.

Figure 7A:
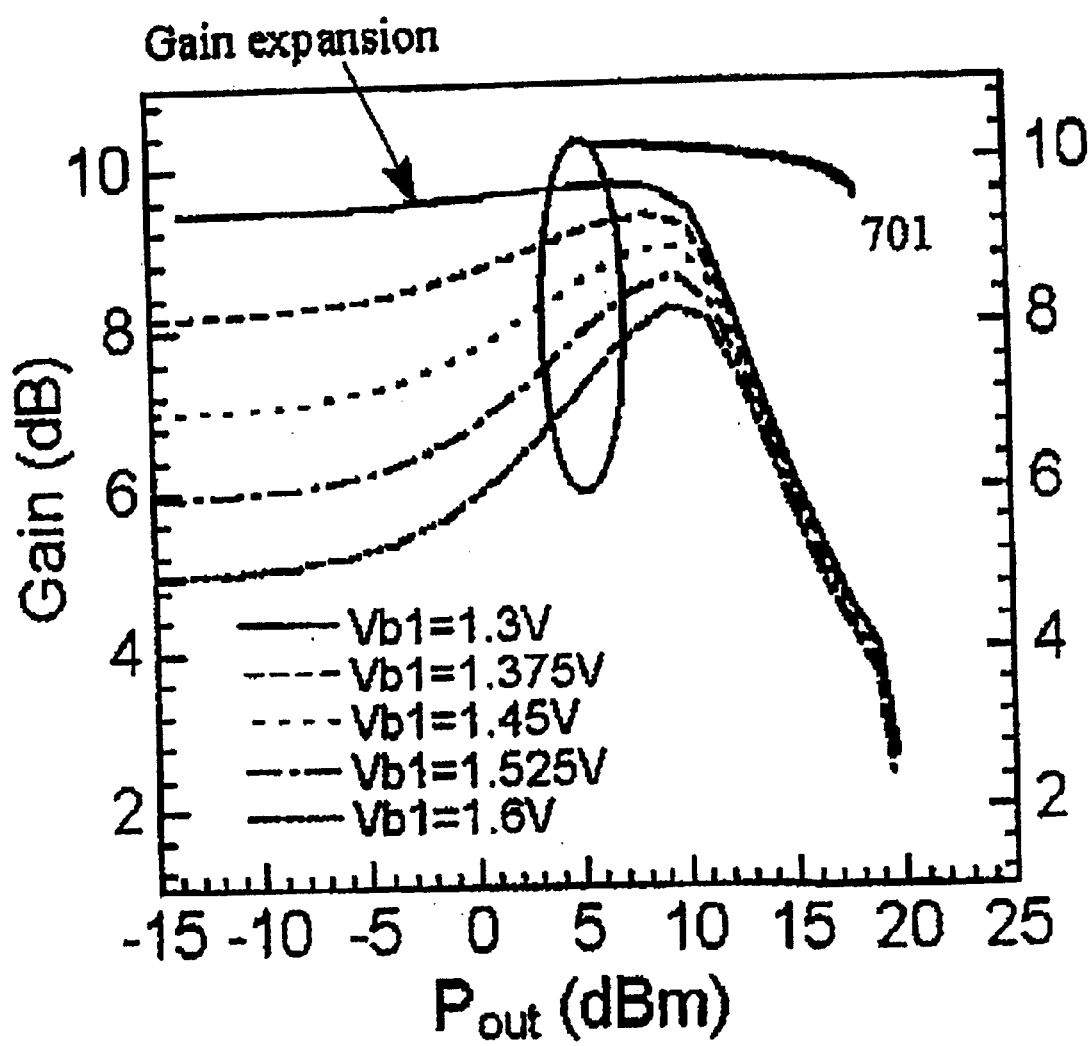
FIG. 7A is a graph shoving the gain characteristics of the active feedforward-type predistorter shown in FIG. 6 as a function of output power Pout and control voltage Vb1.

The family of curve 701, shown in FIG. 7(a) illustrates the insertion gain characteristic of the active feedforward-type predistorter 304 shown in FIG. 6 au a function of output power Pout and DC biasing voltage Vb1. Referring to curves 701, the active feedforward-type predistorter 304 shows good level of gain, allowing amplification of the input signal. The gain of active feedforward-type predistorter 304 increases with the output power, achieving gain expansion, before falling off at the higher output power region. It is the region with gain expression characteristic that is suitable for compensating the nonlinear effects of final stage power amplifier 306. The degree of gain expansion can be controlled by DC biasing voltage Vb1. The gain of the active feedforward-type predistorter 304 decreases when the gain expansion level increases.

Figure 7B:
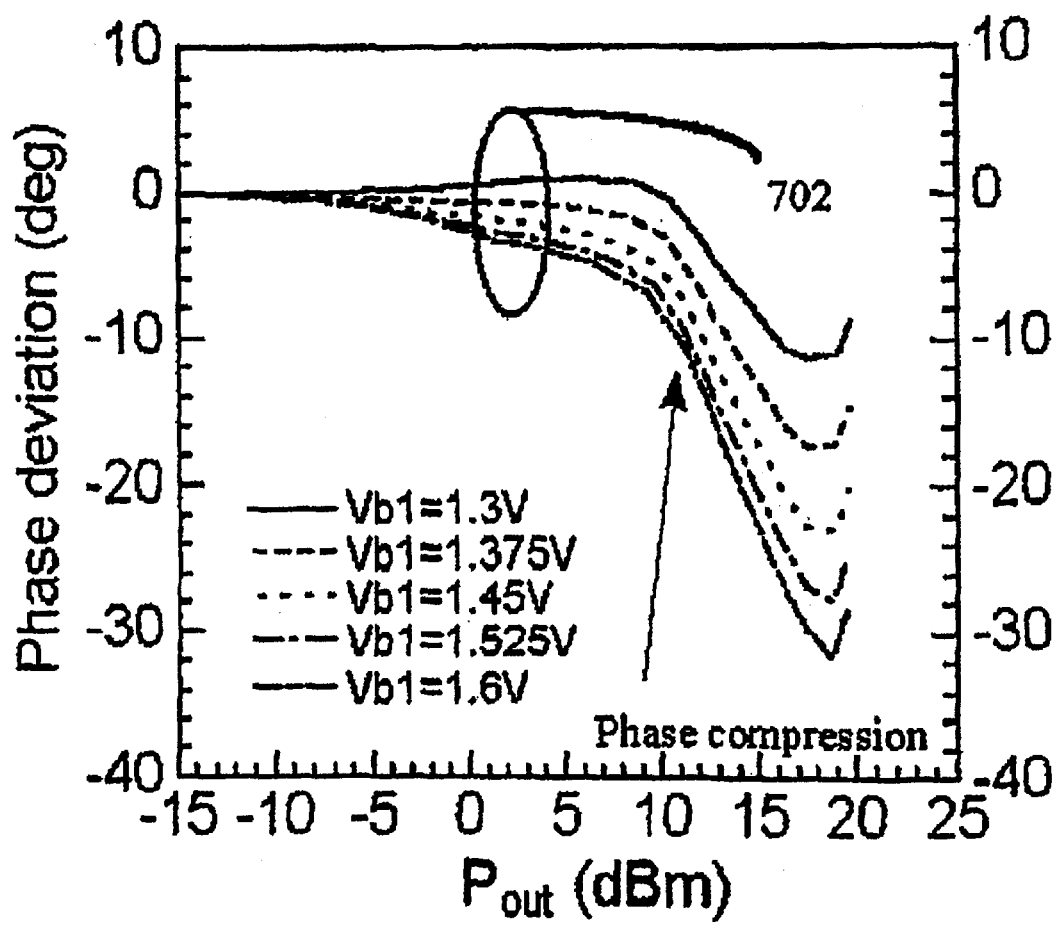
FIG. 7B is a graph showing the phase deviation characteristic of the active feedforward-type predistorter shown in FIG. 6 as a function of output power Pout and control voltage Vb1.

The family of curve 702 shown in FIG. 7(b) illustrates the insertion phase characteristics of the active feedforward-type predistorter 304 shown in FIG. 6 as a function of output power Pout and DC biasing voltage Vb1. Referring to curves 702, the insertion phase of the active feedforward-type predistorter 304 decreases with the increase in output power level. The degree of phase compression is a function of DC biasing voltage Vb1.

Figure 8:
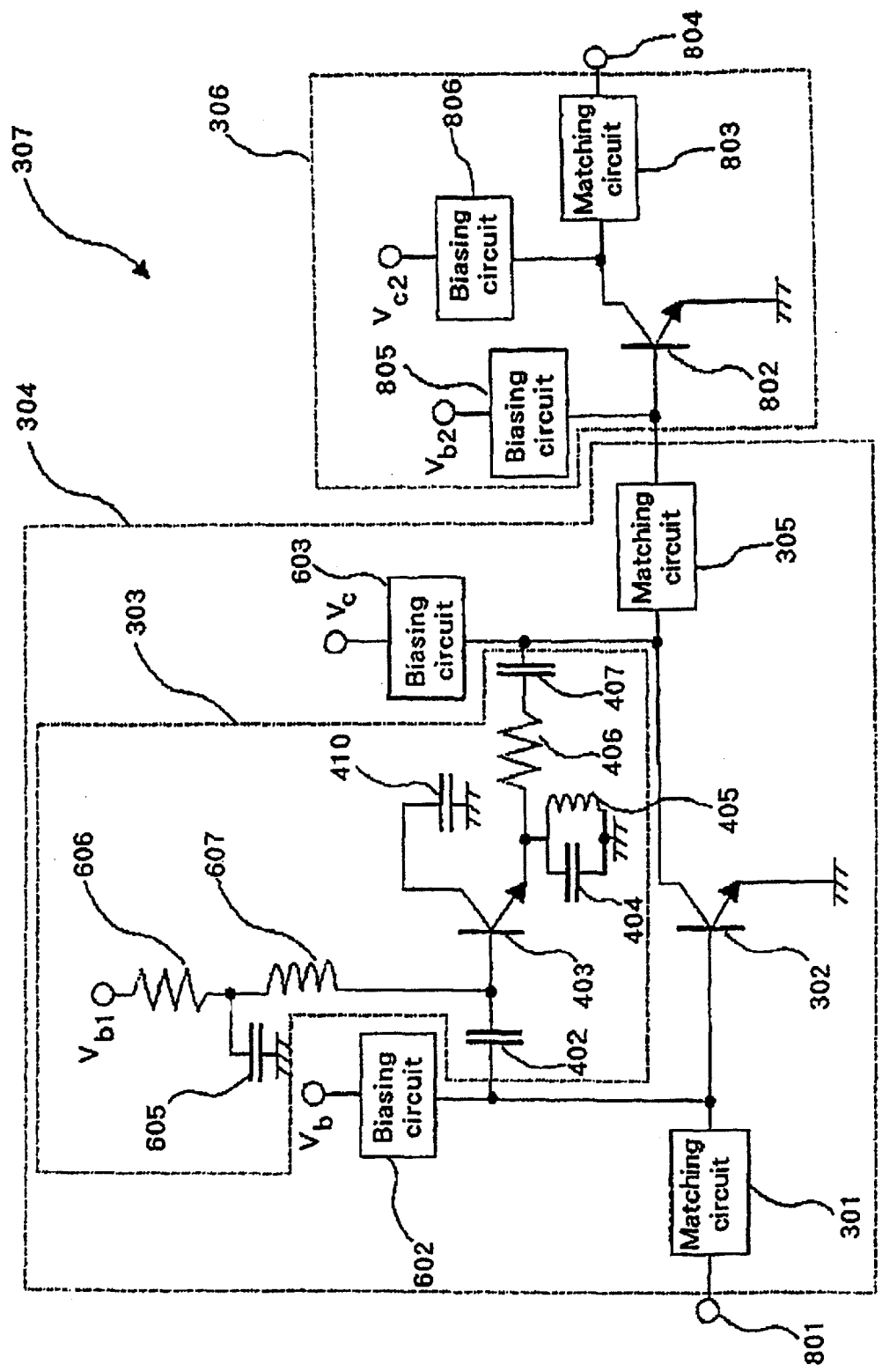
FIG. 8 is a schematic circuit diagram of a two-stage linearized power amplifier incorporating an active feedforward-type predistorter shown in FIG. 6 as the first stage.

FIG. 8 shows a schematic diagram of a two-stage linearized power amplifier 307 according to the present embodiment. The two-stage linearized power amplifier 307 includes an active feedforward-type predistorter 304 and a power amplifier 306 shown in the dash boxes. The power amplifier 306 includes a bipolar transistor 802 with an output matching circuit 803 for matching the collector of the bipolar transistor 802 to a 50 ohm system. The matching circuit 803 may include a circuit of one or any number of lumped or distributed elements, providing any one or all of inductance, capacitance, and resistance, and the elements may be arranged in circuit of any complexity, as may be required by the application. The matching circuit is within the ordinary skill in the art. The biasing circuit 805 and 806 connect the base and collector of the bipolar transistor 802 to the DC biasing voltages Vb2 and Vc2, respectively. The design of the biasing circuits 805 and 806 is within the ordinary skill in the art. The DC biasing voltages Vc2 and Vb2 are set such that the bipolar transistor 803 is biased in active mode to operate as an amplifier.

The configuration of the active feedforward-type predistorter 304 is essentially similar to that illustrated in FIG. 6 with like elements label with like reference numerals, and the detailed functions of like elements are not repeated. In this configuration, the matching circuit 305 in used to match the output impedance of the bipolar transistor 302 to the input impedance of the bipolar transistor 802. The active feedforward-type predistorter 304 is designed to have opposite gain and phase responses to that of the power amplifier 306 as a function of input power. Input signal from the input port 801 is predistorted by the active feedforward-type predistorter 304. The predistorted signal is than fed to the base of the bipolar transistor 802, and amplified by the power amplifier 306. When properly designed, the nonlinear characteristics of the power amplifier 306 are linearized and compensated by the active feedforward-type predistorter 304, thus improving the linearity of the signal at the output 804 of the linearized amplifier 307. The effects are illustrated in FIGS. 9 and 10.

Figure 9A:
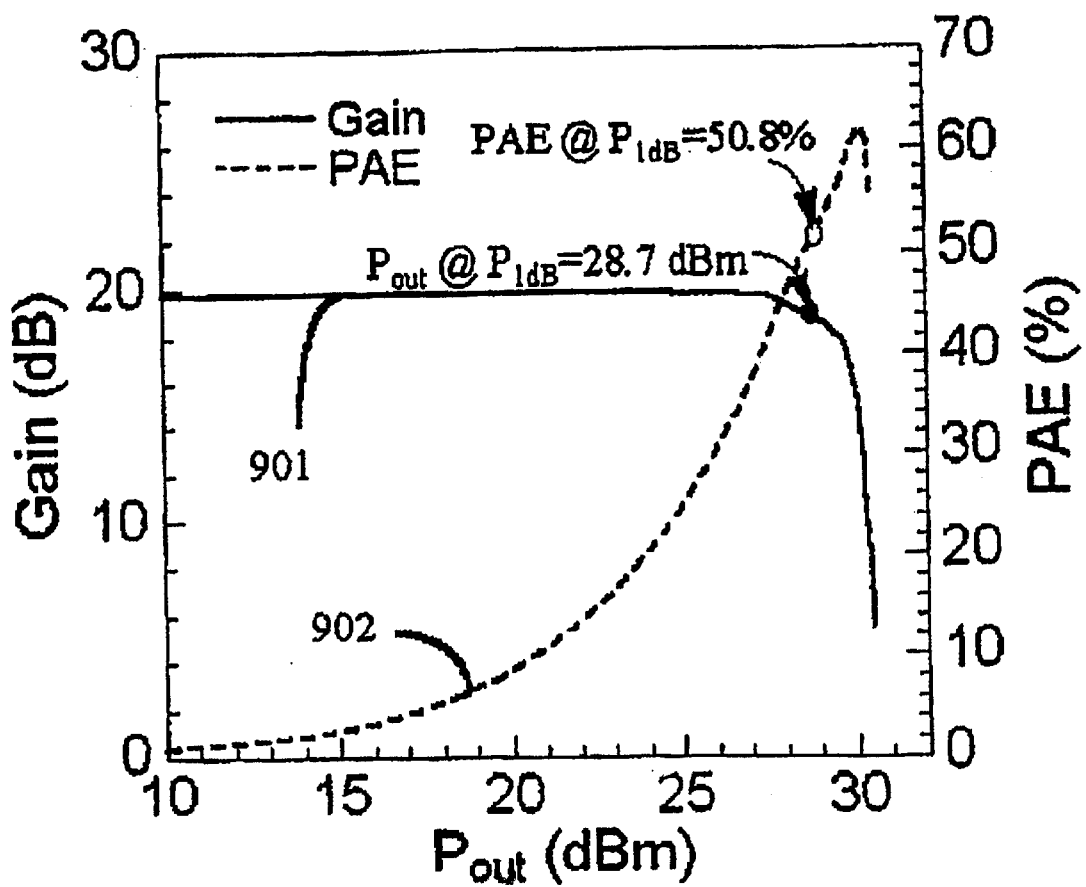
FIG. 9A is a graph showing the gain and PAE (power added efficiency) characteristics of a conventional two-stage power amplifier as a function of output power Pout.

FIG. 9A shows the gain and power added efficiency (PAR) of a conventional two-stage power amplifier, with a configuration similar to the linearized amplifier 307 but without the feedforward-type predistorting circuit 303, au a function of output power Pout. The curve 901 depicts the gain of the amplifier a. a function of output power Pout. The gain of the amplifier compresses when the output power level Pout increases. The output power Pout of the amplifier at 1 dB compression point P1db, which is commonly used am an indication of the linearity of an amplifier, is 28.7 dBm. The curve 902 shows the PAE of the power amplifier am a function of output power Pout. The PAE increases with output power Pout, reaching a peak level before falling of f. At P1dB, the amplifier achieves a PAZ of 50.8%.

Figure 9B:
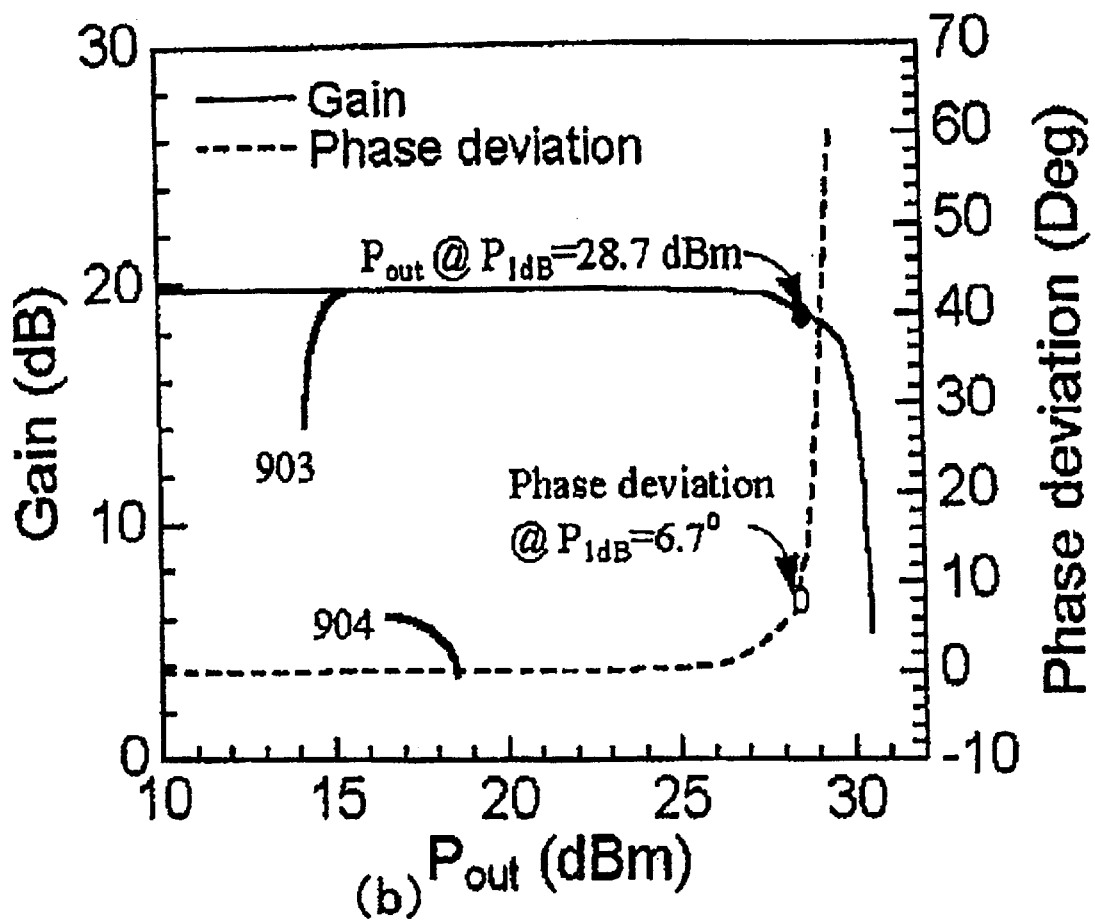
FIG. 9B is a graph showing the gain and phase deviation characteristics of the conventional two-stage power amplifier as a function of output power Pout.

FIG. 9B shows the gain and phase deviation of the conventional two-stage power amplifier, with a configuration similar to the linearized amplifier 307 but without the feedforward-type predistorting circuit 303, as a function of output power Pout. The curve 903 depicts the gain of the amplifier as a function of output power Pout which is similar to curve 901. The curve 904 shows the phase deviation of the power amplifier as a function of output power Pout. The phase deviation is also an indication of the linearity of the amplifier, similar to the 1 dB compression point P1dB or gain deviation. At P1dB, the amplifier shows a phase deviation of 6.7 degrees.

Figure 10A:
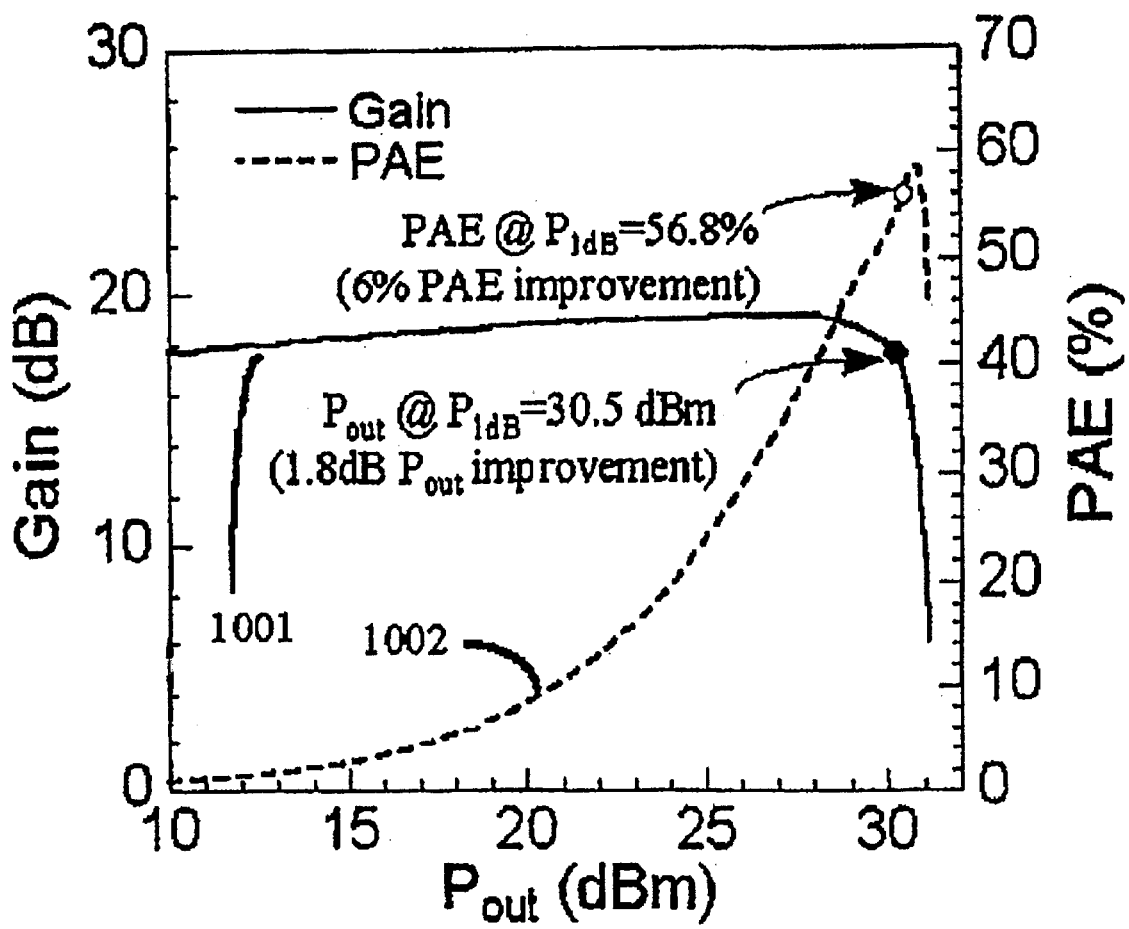
FIG. 10A is a graph showing the gain and PAE characteristics of the linearized two-stage power amplifier shown in FIG. 8 as a function of output power Pout.
Figure 10B:
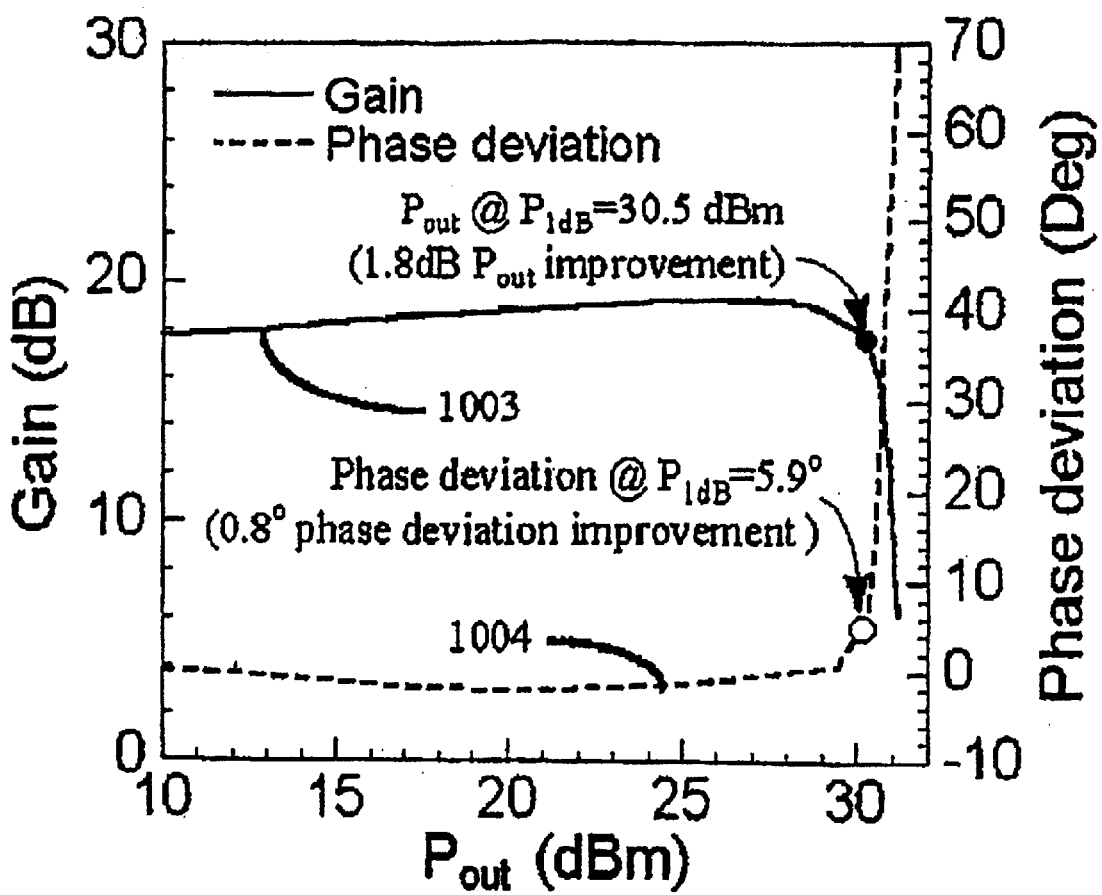
FIG. 10B is a graph showing the gain and phase deviation characteristics of the linearized two-stage power amplifier shown in FIG. 9 as a function of output power Pout.

FIGS. 10A and 10B demonstrate the effect of the active feedforward-type predistorter 304 on compensating the non-linearities of the final stage power amplifier 306. FIG. 10(a) shows the gain and PAE of the linearized two-stage power amplifier 307, according to the present embodiment, as a function of output power Pout. The curve 1001 illustrates the gain and the curve 1002 shows the PAE of the linearized amplifier 307 as a function of output power Pout. DC biasing voltage Vb1 of the active feedforward-type predistorter 304 is adjusted for optimum performance. The linearized amplifier 307 shows an output power Pout of 30.5 dBm at the 1 dB compression point P1dB with a corresponding PAE of 56.8%. Compared to the similar figures shown in FIG. 9(a), the amplifier without the active feedforward-type predistorter 304 has a significantly lower output power Pout and PAZ (28.7 dBm and 50.8%, respectively). These significant improvements are attributed to the fact that the gain expansion characteristic of the active feedforward-type predistorter 304 shown in FIG. 7(a) effectively linearizes the gain compression characteristics of the final stage power amplifier 306.

FIG. 10B shows the gain and phase deviation of the linearized amplifier 307 as a function of output power Pout. The curve 1003 depicts the gain of the linearized amplifier 307 as a function of output power Pout which is similar to curve 1001. The curve 1004 shows the phase deviation of the linearized amplifier 307 as a function of output power Pout. The phase deviation is also an indication of the linearity of the amplifier, similar to the 1 dB compression point P1dB. At P1dB, the linearized amplifier 307 shows a phase deviation of 5.9 degrees. Compared to the similar figure shown in FIG. 9B, the amplifier without the active feedforward-type predistorter 304 has a higher phase deviation of 6.7 degrees. The reduction of this nonlinear phase is due to the fact that the phase compression characteristic of the active feedforward-type predistorter 304 shown in FIG. 7(b) effectively linearizes the phase expansion characteristic of the final stage rower amplifier 306, thus improving the linearity of the linearized amplifier 307.

Figure 11:
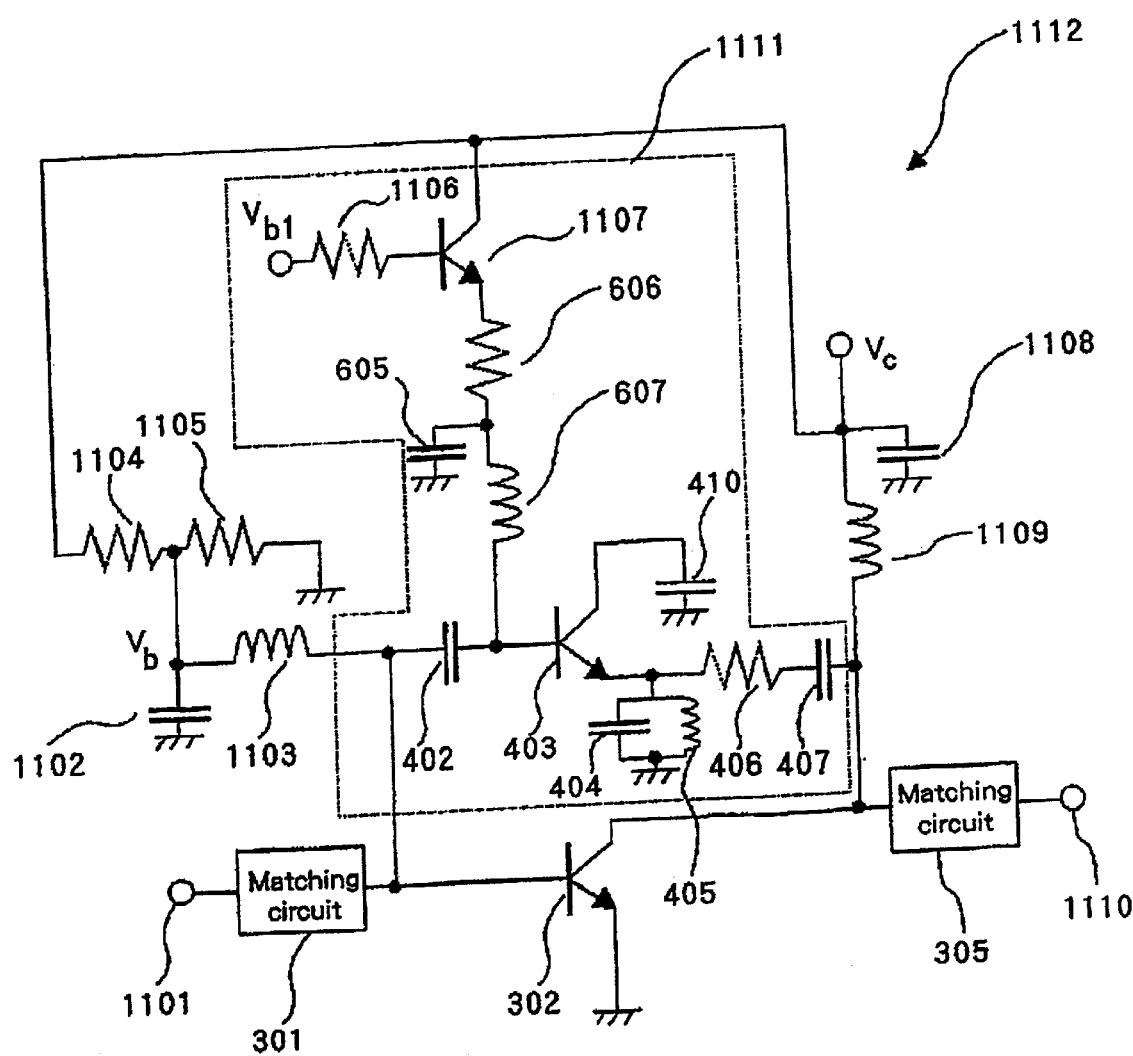
FIG. 11 is a schematic circuit diagram of an active feedforward-type predistorter with a tunable bias circuit for the control of the predistorter characteristics according to another embodiment of the present invention.

FIG. 11 shows another embodiment according to this invention. This embodiment shows a compact realization of biasing circuits and tunable biasing circuit for the active feedforward-type predistorter 1112. Apart from the biasing circuits for the bipolar transistor 302 and the tunable biasing circuit for feedforward-type predistorting circuit 1111, the active feedforward-type predistorter 1112 is essential identical to the one presented in FIG. 6 with like elements label with like reference numerals, and their basic functions are thus not repeated further.

The collector bias of the bipolar transistor 302 is provided by the DC power supply Vc which connects to the collector of the bipolar transistor 302 via an RF choke 1109. The RF choke 1109 is used to block the RF signal from reaching the DC biasing voltage Vc. A bypass capacitor 1108 connects between the DC biasing voltage Vc and the RF choke 1109 to ground which removes high frequency noise.

The base biasing circuit of the bipolar transistor 302 consists of a resistive bridge with two resistors 1104 and 1105 connected in series, which divides the DC supply voltage Vc into base biasing voltage Vb according the ratio of the resistance between the two resistors 1104 and 1105. The DC voltage divided between the resistors 1104 and 1105 couples to the base of the bipolar transistor 302 via an RF choke 1103 and sets the base bias voltage of the bipolar transistor 302. The RF choke 1103 is used to block the RF signal from reaching the DC power source Vc. A bypass capacitor 1102 connects between the RF choke 1103 and ground which removes high frequency noise.

The tunable biasing circuit for the feedforward-type predistorting circuit 1111 includes a bipolar transistor 11.07 with the collector connected to the DC power source Vc. DC voltage source Vb1 connects to the base of the bipolar transistor 1107 via a resistor 1106 which sets the base current of the bipolar transistor 1107. The emitter of the bipolar transistor 1107 connects to a resistor 606 which sets the current flowing into the base of the bipolar transistor 403. By varying the DC voltage source Vb1, the collector-to-emitter voltage of the bipolar transistor 1107 changes accordingly. The emitter voltage of the bipolar transistor 11.07 is therefore controlled by the DC voltage source Vb1. When the emitter voltage of the bipolar transistor 1107 changes, the current flowing into the base of the bipolar transistor 403 alters and changes the biasing point of the bipolar transistor 403, allowing to adjust the predistortion characteristics of the active feedforward-type predistorter 1112.

Figure 12:
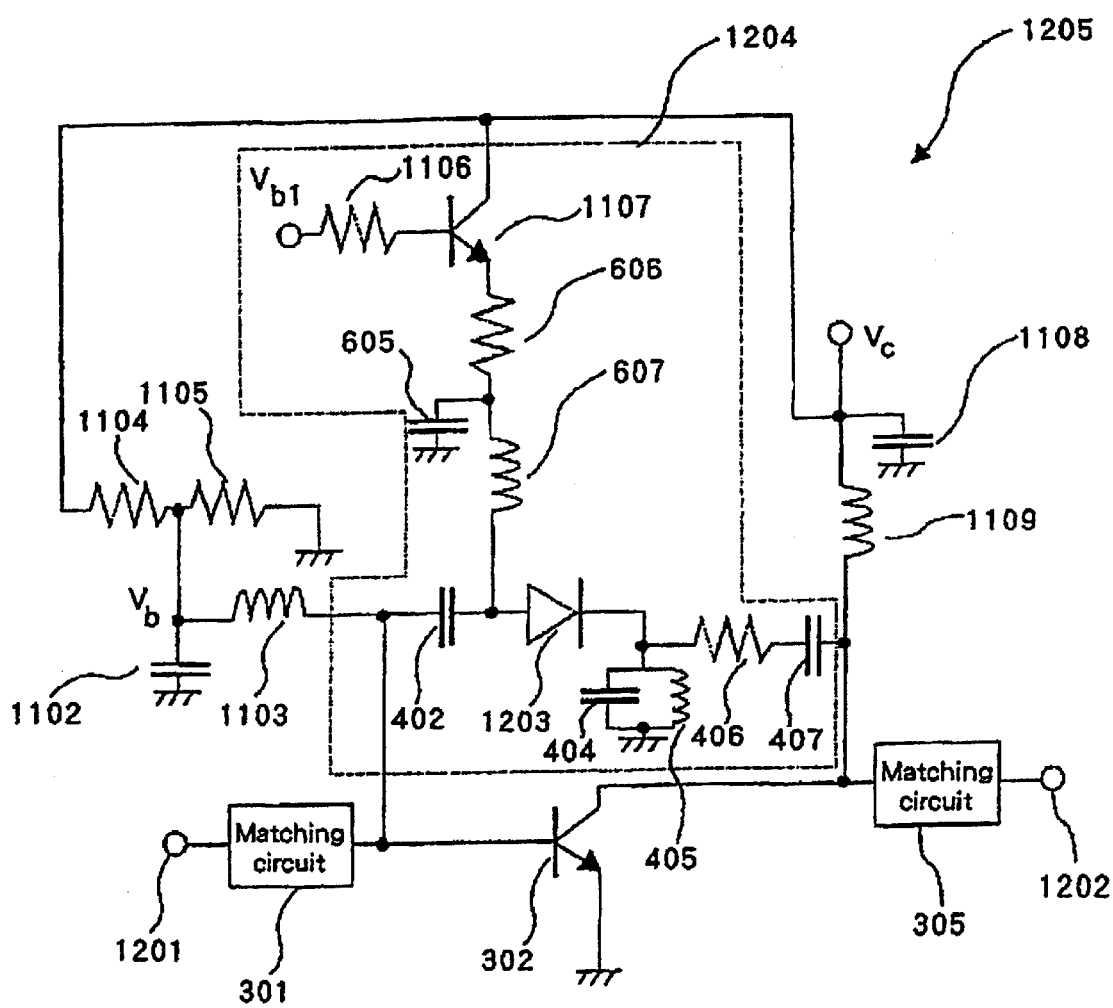
FIG. 12 is schematic circuit diagram of an active feedforward-type predistorter with a tunable bias circuit f or the control of the predistorter characteristics according to another alternative embodiment of the present invention.

FIG. 12 shows another embodiment according to this invention. This embodiment includes an active feedforward-type predistorter 1205 which is a modified version of FIG. 11 wherein diode 1203 is employed for the non-linearity generation in the active feedforward-type predistorter 1205 instead of the bipolar transistor 403 illustrated in FIG. 11. Like elements in FIG. 12 and FIG. 11 have the same reference numerals, and their basic functions are thus not repeated further.

The feedforward-type predistorting circuit 1204 in the active feedforward-type predistorter 1205 includes a diode 1203. To achieve the predistortion characteristics, the diode 1203 is slightly forward biased such that it operates in the nonlinear region. The degree of nonlinearity depends on the DC biasing voltage Vb1. Resistor 406 determines the degree of signal to be feedforwarded from the base to the collector of the bipolar transistor 302. The inductor 405 provides a DC path to ground whilst the capacitor 404 reduces the forward insertion loss of the feedforward-type predistorting circuit 1203. The characteristics of the active feedforward-type predistorter 1205 depend on the DC biasing voltage Vb1, the capacitors 402, 404, 407 and the resistor 406. The values of these elements are chosen for optimum predistortion characteristics.

While the innovation has been described with reference to embodiments employing bipolar transistors as example, other technologies, such as silicon bipolar transistors, III–V hetero-junction bipolar transistors (HBTs), MOFSETs (metal-oxide-semiconductor field effect transistors), MES-FETs (metal semiconductor field effect transistors), HEMTs (high electron mobility transistors) and other III–V material systems can be used.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A linearized amplifier comprising:
   an RF input node;
   an RF output node;
   a power amplifier having an input and an output, and having a gain characteristic which decreases with the increase in input power applied to said input of said power amplifier, and having a phase characteristic which increases with input power applied to said input of said power amplifier; and
   an active feedforward-type predistorter having an input and an output, acting as a driver amplifier which amplifies a signal applied to said RF input node, having a gain characteristic which increases with input power applied to said input of said active feedforward-type predistorter for compensating the decrease in gain of said power amplifier, and having a phase characteristic which decreases with the increase in input power applied to said input of said active feedforward-type predistorter for compensating the increase in phase of said power amplifier;
   wherein said output of said power amplifier is coupled to said RF output node, said input of said active feedforward-type predistorter is coupled to said RF input node, and said output of said active feedforward-type predistorter is coupled to said input of said power amplifier.

2. A linearized amplifier comprising:
   an RF input node;
   an RF output node;
   a power amplifier having an input and an output, and having a gain characteristic which decreases with the increase in input power applied to said input of said power amplifier, and having a phase characteristic which increases with input power applied to said input of said power amplifier; and
   an active feedforward-type predistorter having an input and an output, acting as a driver amplifier which amplifies a signal applied to said RF input node, having a gain characteristic which increases with input power applied to said input of said active feedforward-type predistorter for compensating the decrease in gain of said power amplifier, and having a phase characteristic which decreases with the increase in input power applied to said input of said active feedforward-type predistorter for compensating the increase in phase of said power amplifier, wherein said output of said power amplifier is coupled to said RF output node, said input of said active feedforward-type predistorter is coupled to said RF input node, and said output of said active feedforward-type predistorter is coupled to said input of said power amplifier, wherein the active feedforward-type predistorter comprises:
   a predistorter RF input node;
   a predistorter RF output node;
   a ground node;
   a first and second DC power supply node;
   a bipolar transistor having a collector, a base and an emitter;
   a first matching circuit having an input coupled to said predistorter RF input node and an output coupled to said bipolar transistor base for matching said bipolar transistor base to a first predetermined impedance;
   a second matching circuit having an input coupled to said bipolar transistor collector and an output coupled to said predistorter RF output node for matching said bipolar transistor collector to a second predetermined impedance;
   a feedforward-type predistorting circuit having an input coupled to said bipolar transistor base and an output coupled to said bipolar collector;
   a first biasing circuit having an input coupled to said first DC power supply node and an output coupled to said bipolar transistor base; and
   a second biasing circuit having an input coupled to said second DC power supply node and an output coupled to said bipolar transistor collector;
   wherein said bipolar transistor emitter is coupled to said ground node.

3. The linearized amplifier as claimed in claim 2, wherein the bipolar transistor in the active feedforward-type predistorter is biased in active mode for amplification purpose through the first and second DC power supply nodes in said active feedforward-type predistorter.

4. The linearized amplifier as claimed in claim 2, wherein the active feedforward-type predistorter has an insertion gain characteristic which increases with input power.

5. The linearized amplifier as claimed in claim 4, wherein the active feedforward-type predistorter has an insertion phase characteristic which decreases with the increase in input power.

6. The linearized amplifier as claimed in claim 5, wherein said feedforward-type predistorting circuit comprises:
   an RF input node;
   an RF output node;
   a ground node;
   a DC power supply node;
   a bipolar transistor having a collector, a base and an emitter;
   a first capacitor having an input coupled to said RF input node and an output coupled to said base of said bipolar transistor;
   a second capacitor having an input coupled to said bipolar transistor collector and an output coupled to said ground node;
   a third capacitor having an input and an output;
   a LC-network having an input coupled to said bipolar transistor emitter and an output coupled to said ground node;
   a resistor having an input coupled to said bipolar transistor emitter and an output coupled to said third capacitor input; and
   a biasing circuit having an input coupled to said DC power supply node and an output coupled to said bipolar transistor base;

wherein said third capacitor output is coupled to said RF output node.

7. The linearized amplifier as claimed in claim 6, wherein the LC-network in the feedforward-type predistorting circuit comprises an inductor and a capacitor connected in parallel.

8. The linearized amplifier as claimed in claim 6, wherein said bipolar transistor in the feedforward-type predistorting circuit is slightly forward biased for non-linearities generation through the DC power supply node of the feedforward-type predistorting circuit.

9. The linearized amplifier as claimed in claim 6, wherein said feedforward-type predistorting circuit has an insertion loss characteristic which decreases with the increase in input power.

10. The linearized amplifier as claimed in claim 7, wherein said feedforward-type predistorting circuit has an insertion phase characteristic which decreases with the increase in input power.

11. The linearized amplifier as claimed in claim 10, wherein the biasing circuit in the feedforward-type predistorting circuit is a tunable biasing circuit for adjusting the characteristics of the active feedforward-type predistorter electronically.

12. The linearized amplifier as claimed in claim 11, wherein said tunable biasing circuit comprises:
   an input node;
   an output node;
   a ground node;
   a bipolar transistor having a collector, a base and an emitter;
   an inductor having an input and an output;
   a first resistor having an input coupled to said input node and an output coupled to said base of said bipolar transistor;
   a second resistor having an input coupled to said bipolar transistor emitter and an output coupled to said inductor input; and
   a capacitor having an input coupled to said second resistor output and an output coupled to said ground node;
   wherein said bipolar transistor collector is coupled to said second DC power supply node in the active feedforward-type predistorter, and said inductor output is coupled to said output node.

13. The linearized amplifier as claimed in claim 12, wherein the DC power supply node in the feedforward-type predistorting circuit can be adjusted externally which changes the biasing voltage applied to the bipolar transistor base in the feedforward-type predistorting circuit to change the gain and phase characteristics of the active feedforward-type predistorter.

14. The linearized amplifier as claimed in claim 5, wherein the feedforward-type predistorting circuit comprises:
   an RF input node;
   an RF output node;
   a ground node;
   a DC power supply node;
   a diode having an input and an output;
   a first capacitor having an input coupled to said RF input node and an output coupled to said diode input;
   a second capacitor having an input and an output;
   a LC-network having an input coupled to said diode output and an output coupled to said ground node;
   a resistor having an input coupled to said diode output and an output coupled to said second capacitor input; and
   a biasing circuit having an input coupled to said DC power supply node and an output coupled to said diode input;
   wherein said second capacitor output is coupled to said RF output node.

15. The linearized amplifier as claimed in claim 14, wherein the LC-network in the feedforward-type predistorting circuit comprises an inductor and a capacitor connected in parallel.

16. A linearized amplifier as claimed in claim 14, wherein the diode in the feedforward-type predistorting circuit is slightly forward biased for non-linearities generation through the DC power supply node of the feedforward-type predistorting circuit.

17. The linearized amplifier as claimed in claim 14, wherein the feedforward-type predistorting circuit has an insertion gain characteristic which decreases with the increase in input power.

18. The linearized amplifier as claimed in claim 17, wherein the feedforward-type predistorting circuit has an insertion phase characteristic which decreases with the increase in input power.

19. The linearized amplifier as claimed in claim 18, wherein the biasing circuit in the feedforward-type predistorting circuit is a tunable biasing circuit for adjusting the characteristics of the active feedforward-type predistorter electronically.

20. The linearized amplifier as claimed in claim 19, wherein the tunable biasing circuit comprises:
   an input node;
   an output node;
   a ground node;
   a bipolar transistor having a collector, a base and an emitter;
   an inductor having an input and an output;
   a first resistor having an input coupled to said input node and an output coupled to said bipolar transistor base;
   a second resistor having an input coupled to said bipolar transistor emitter and an output coupled to said inductor input; and
   a capacitor having an input coupled to said second resistor output and an output coupled to said ground node;
   wherein said bipolar transistor collector is coupled to the second DC power supply node in the active feedforward-type predistorter, and said inductor output is coupled to said output node.

21. The linearized amplifier as claimed in claim 20, wherein the DC power supply node in the feedforward-type predistorting circuit can be adjusted externally which changes the biasing voltage applied to the diode input in said feedforward-type predistorting circuit to change the gain and phase characteristics of the active feedforward-type predistorter.

22. The linearized amplifier as claimed in claim 1, wherein the amplifying of the signal applied to said RF input node by the active feedforward-type predistorter provides insertion gain to the input signal.

* * * * *